United States Patent

Kawamura

[11] Patent Number: 5,858,807
[45] Date of Patent: Jan. 12, 1999

[54] METHOD OF MANUFACTURING LIQUID CRYSTAL DISPLAY DEVICE

[75] Inventor: Shinichi Kawamura, Yokohama, Japan

[73] Assignee: Kabushiki Kaisha Toshiba, Kawasaki, Japan

[21] Appl. No.: 702,015

[22] Filed: Aug. 23, 1996

[30] Foreign Application Priority Data

Jan. 17, 1996 [JP] Japan .................................. 8-005335

[51] Int. Cl.$^6$ .................................................. H01L 21/00
[52] U.S. Cl. ........................ 438/30; 438/29; 148/DIG. 91
[58] Field of Search .............. 438/29, 30; 148/DIG. 91, 148/DIG. 92, DIG. 93, DIG. 94

[56] References Cited

U.S. PATENT DOCUMENTS

| H1637 | 3/1997 | Offord et al. | 148/DIG. 92 |
|---|---|---|---|
| 4,963,503 | 10/1990 | Aoki et al. | 148/DIG. 91 |
| 5,306,651 | 4/1994 | Masumo et al. | 148/DIG. 91 |
| 5,403,762 | 4/1995 | Takemura | 148/DIG. 91 |

FOREIGN PATENT DOCUMENTS 2-78217  3/1990  Japan .

*Primary Examiner*—Joni Chang
*Attorney, Agent, or Firm*—Pillsbury Madison & Sutro LLP

[57] ABSTRACT

A method of manufacturing a liquid crystal display device, which comprises the steps of forming an amorphous silicon layer on a substrate, and irradiating, by way of scanning, a linear energy beam onto the amorphous silicon layer, thereby converting an irradiated portion of the an amorphous silicon layer into a polycrystalline silicon layer. The irradiation and scanning of the linear energy beam are performed plural times while shifting the scanning of the linear energy beam so as to allow the irradiation of the linear energy beam to cover every region of the amorphous silicon layer that is desired to be converted into a polycrystalline silicon layer. The scanning of linear energy beam is performed in such a manner that an edge portion of one irradiated region is overlapped by an edge portion of the next neighboring irradiated region in a plurality times of scanning of the linear energy beam thereby forming an overlapped region, and that a boundary to be formed between the overlapped region and non-overlapped region becomes non-linear in shape.

10 Claims, 6 Drawing Sheets

SECTIONAL PROFILE IN THE LATERAL DIRECTION OF LINEAR BEAM

SECTIONAL PROFILE IN THE LONGITUDINAL DIRECTION OF LINEA BEAM

METHOD OF MANUFACTURING LIQUID CRYSTAL DISPLAY DEVICE

BACKGROUND OF THE INVENTION

1. Field of the Invention

This invention relates to a method of manufacturing a liquid crystal display device, and in particular to a method of scanning a linear energy beam for crystallizing amorphous silicon into polycrystalline silicon by irradiating the linear energy beam onto the amorphous silicon plural times.

2. Description of the Related Art

As a method of manufacturing a thin film transistor of a liquid crystal display device, there has been developed a method of forming source and drain regions, which is featured in that part of amorphous silicon layer is converted to a low resistance layer by partially polycrystallizing the amorphous silicon layer. As a method of polycrystallizing an amorphous silicon layer, an energy beam is employed to melt and then recrystallize the amorphous silicon layer.

As for the method of irradiating the energy beam, there is proposed in Japanese Patent Unexamined Publication Shou/61-187,222 a method of linearly irradiating the energy beam.

Further, Japanese Patent Unexamined Publication Hei/2-78,217 discloses a method of irradiating a linear energy beam by scanning it plural times in such a manner that an overlapping region is constantly formed between the neighboring irradiated regions of the energy beam.

However, if an overlapping region of energy beam is constantly formed as mentioned above, the irradiation dosage of the energy beam at the overlapping region naturally becomes larger than that in other regions, so that the characteristics of a thin film transistor, in particular, the threshold characteristics thereof is delicately altered, thereby giving rise to a problem of non-uniformity of display image. In particular, if the irradiation of energy beam is carried out so as to constantly form an overlapping region as mentioned above, the non-uniformity of display image is caused to appear in the form of a straight line and in a visually exaggerated manner.

SUMMARY OF THE INVENTION

Therefore, an object of this invention is to provide a specific method of irradiating a linear energy beam, which is featured in that the visual non-uniformity in display image can be effectively suppressed.

Namely, according to the present invention, there is provided a method of manufacturing a liquid crystal display device, which comprises the steps of forming an amorphous silicon layer on a substrate; and irradiating, by way of scanning, a linear energy beam onto the amorphous silicon layer, thereby converting an irradiated portion of the amorphous silicon layer into a polycrystalline silicon layer; wherein the irradiation and scanning of the linear energy beam are performed plural times while shifting the scanning of the linear energy beam so as to allow the irradiation of the linear energy beam to cover every region of the amorphous silicon layer that is desired to be converted into a polycrystalline silicon layer, and the scanning of linear energy beam is performed in such a manner that an edge portion of one irradiated region is overlapped by an edge portion of the next neighboring irradiated region in a plurality times of scanning of the linear energy beam thereby forming an overlapped region, and that a boundary to be formed between the overlapped region and non-overlapped region becomes non-linear in shape.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

This invention will be further explained with reference to drawings illustrating preferred embodiments of this invention.

Figure 1:
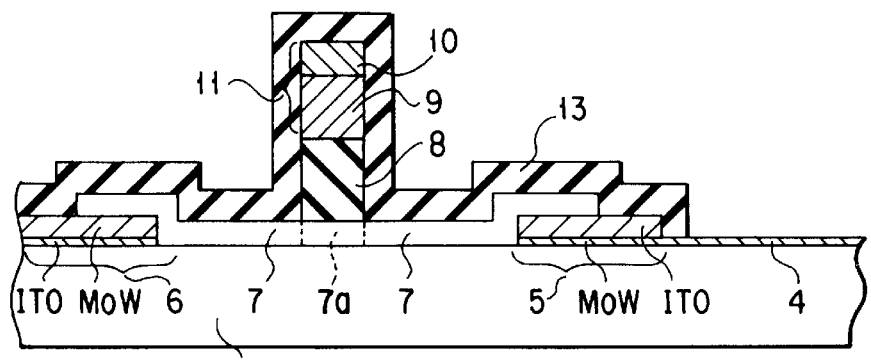
FIG. 1 is a cross-sectional view of a thin film transistor of a liquid crystal display device according to one embodiment of this invention.

FIG. 1 represents a thin film transistor (TFT) to be employed in one embodiment of this invention. Referring to FIG. 1, a pixel electrode 4 consisting of indium-tin oxide (ITO) is formed on an insulating substrate 1 made of glass. On this insulating substrate 1 are further formed a source electrode 5 and a drain electrode 6. An underlying layer comprising an ITO film is formed underneath the drain electrode 6, thus forming a 2-ply structure. The source electrode 5 is also provided thereunder with an ITO film extending from the pixel electrode 4.

An active layer 7a consisting of amorphous silicon is formed between n-type polycrystalline silicon layers 7 connecting to the source electrode 5 and the drain electrode 6, respectively. A gate insulating film 8 consisting of silicon nitride ($SiN_x$) is formed on the surface of the semiconductor layer 7. On this gate insulating film 8 is further disposed a gate electrode 11 consisting of an aluminum (Al) layer 9 and a molybdenum (Mo) layer 10. The entire surface of this TFT is then covered with a silicon nitride passivation film 13 as an uppermost layer.

Figure 2A:
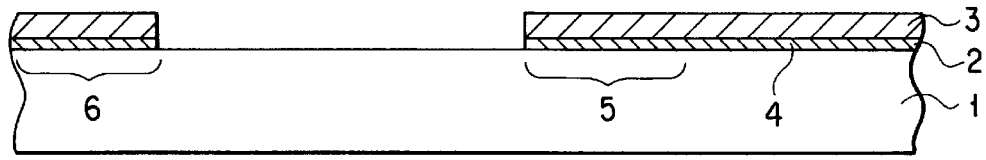
FIGS. 2A to 2C respectively shows steps of manufacturing the thin film transistor shown in FIG. 1.

A method of manufacturing this TFT constructed as explained above will be now explained in detail with reference to FIGS. 2A to 2C.

First of all, an ITO film 2 and a MoW alloy film 3 are successively formed by way of a sputtering method on the surface of the insulating substrate 1 made of glass. Then, these ITO film 2 and MoW alloy film 3 are patterned by making use of a photolithography method, whereby forming the pixel electrode 4, a drain line, the source electrode 5 and the drain electrode 6 (FIG. 2A). At this moment, the pixel electrode 4 is covered thereon with the MoW alloy film 3, which is however subsequently removed.

Figure 2B:
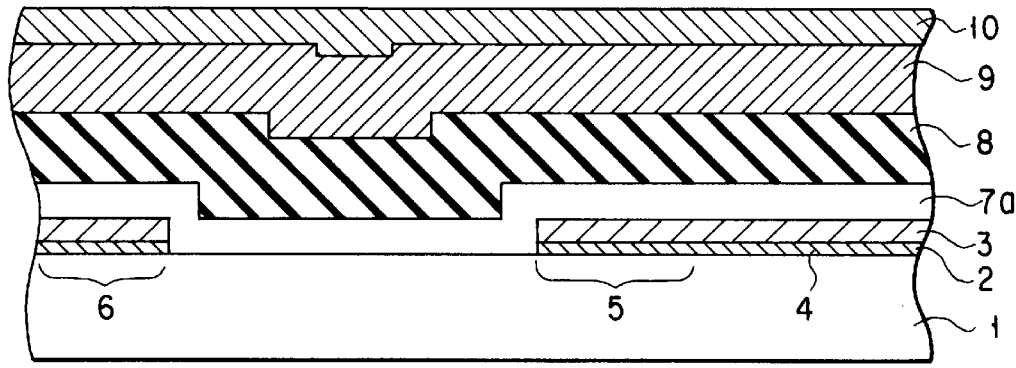
Figure 2C:
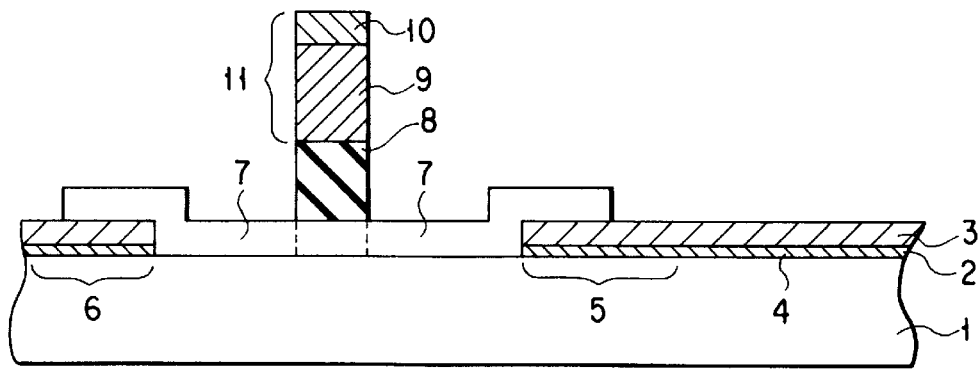

Then, as shown in FIG. 2B, an amorphous silicon layer 7a having a thickness of 1,000 angstroms and a silicon nitride film 8 having a thickness of 4,000 angstroms are successively deposited on the insulating substrate 1 by making use of a plasma CVD method. Subsequently, the Al film 9 and Mo film 10 are successively deposited by means of sputtering. Then, these Mo film 10, Al film 9 and $SiN_x$ film 8 are successively patterned through the same resist pattern by making use of photolithography, whereby forming a gate electrode 11 of 2-ply structure consisting of the Al film 9 and Mo film 10, and a gate insulating film 8 consisting of a $SiN_x$ film. Care should be taken at this occasion not to perform the etching to such a depth that the amorphous silicon layer 7a would be etched away. For the purpose of preventing the over-etching intruding down into the amorphous silicon layer 7a, a film such as silicon oxide ($SiO_x$) may be formed in advance on the surface of the amorphous silicon layer 7a.

Thereafter, with the gate electrode 11 being used as a mask, phosphorus (P) is doped into the amorphous silicon layer 7a by making use of an ion-implantation apparatus of non-mass separation type, while controlling the accelerating voltage thereof to 60 kV, and the dosage thereof to $3 \times 10^{15}$ $cm^{-2}$, thereby turning a portion of the amorphous silicon layer 7a into an n-type amorphous silicon. Then, by making use of a XeCl excimer laser capable of emitting a laser beam of 308 nm in wavelength, an energy beam with an energy density of 150 $mJ/cm^2$ is irradiated onto the amorphous silicon layer 7a, thereby converting the P-doped portion of the amorphous silicon layer 7a into an n-type polycrystalline silicon layer 7, which is then subjected to an etching treatment using a photolithography method to form a source-drain contact region (FIG. 2C).

Thereafter, the entire surface of the resultant structure is covered with the deposition of $SiN_x$ by means of a plasma CVD method, thereby forming the passivation film 13. Subsequently, a portion of the passivation film 13 disposed on the peripheral electrodes and on the pixel electrode is etched away by means of a photolithography method. Since the MoW alloy 3 is still left remained on the surface of the pixel electrode 4 consisting of ITO at this moment, this MoW alloy 3 is etched away.

As a result, an array substrate for a liquid crystal display device which is provided, as shown in FIG. 1, with a TFT comprising the source electrode 5, the drain electrode 6, the pixel electrode 4, the polycrystalline semiconductor layer 7, the gate insulating film 8, the gate electrode 9 and the protecting film 13 can be obtained.

In the followings, explanations regarding the aforementioned linear energy beam irradiation that will be employed for crystallizing an amorphous silicon into a polycrystalline silicon will be set forth in detail.

Figure 3:
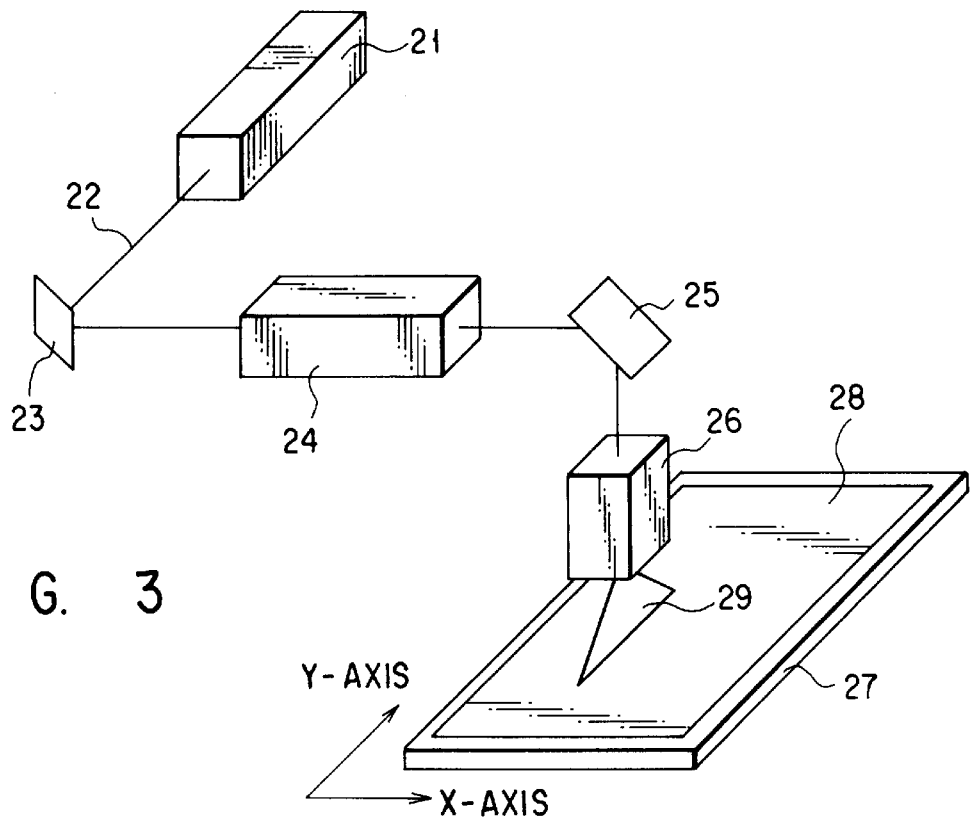
FIG. 3 is a schematic perspective view of an excimer laser annealing apparatus to be employed in one embodiment of this invention.

FIG. 3 illustrates the outer appearance of the excimer laser annealing apparatus employed in this embodiment. This excimer laser annealing apparatus is provided with an optical system for forming a linear energy beam.

The laser beam-generating source employed in FIG. 3 is a XeCl excimer laser beam-generating source 21 which is capable of oscillating a laser beam of 308 nm in wavelength. The energy beam 22 oscillated from the excimer laser beam-generating source 21 is reflected by a first mirror 23 thereby being forced to change its course, and then passes through an optical system 24 comprising a homogenizer to reach a second mirror 25 where the energy beam 22 is again forced to change its course.

Finally, the energy beam is imaged via an image-forming lens 26 as a linear beam 29 on a substrate 28 mounted on a stage 27. This stage 27 is adapted to be shifted in the direction X-axis, while the optical system including the first mirror 23 placed as a starting component and the image-forming lens 26 placed as a final component is adapted to be integrally shifted in the direction Y-axis. In this case, the scanning direction is defined as being the direction of X-axis, while the direction perpendicular to the scanning direction is defined as being the direction of Y-axis.

Figure 4A:
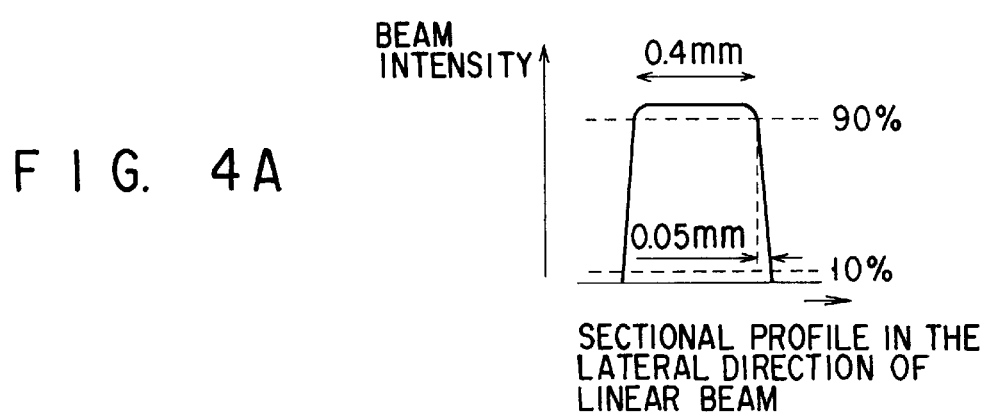
FIGS. 4A and 4B respectively shows a graph showing relationships between the irradiation width in X-axis direction and the beam intensity, and between the irradiation width in Y-axis direction and the beam intensity of the linear energy beam to be employed in one embodiment of this invention.
Figure 4B:
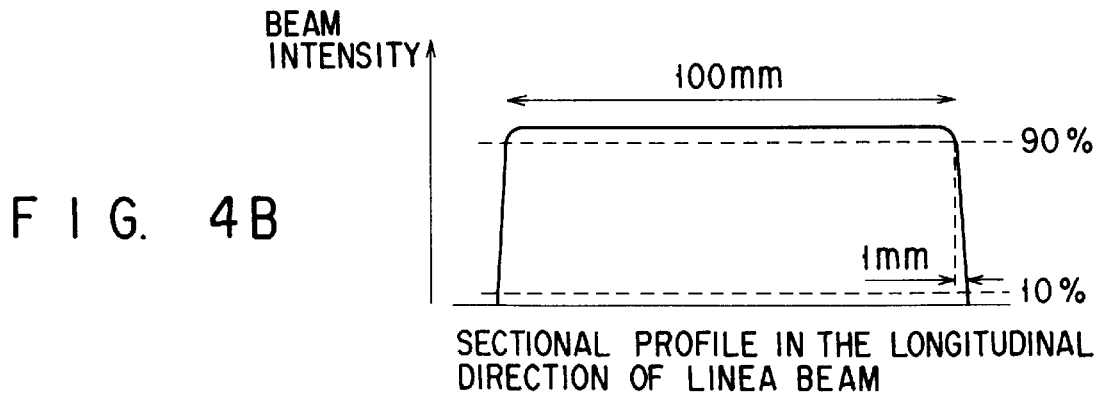

FIG. 4A represents a cross-sectional profile in the X-axis direction of the linear energy beam intensity, while FIG. 4B represents a cross-sectional profile in the Y-axis direction of the linear energy beam intensity. The cross-sectional profile in either direction of the linear energy beam intensity is trapezoidal having a flat top. The length in the X-axis direction (cross direction) of the portion having a uniform energy intensity is 0.4 mm, while the length in the Y-axis direction (longitudinal direction) of the portion having a uniform energy intensity is 100 mm. However, the length at the distal end portion of linear energy beam density in either of X-axis and Y-axis is enlarged as illustrated in FIGS. 4A and 4B, i.e. it is enlarged by about 0.05 mm as for X-axis and by about 1 mm as for Y-axis as the length at 10% of the maximum energy intensity is compared with the length at 90% of the maximum energy intensity.

The optical system including the first mirror 23 placed as a starting component and the image-forming lens 26 placed as a final component is shifted synchronously with the oscillation of the energy beam. At the same time, the stage 29 is shifted by a distance of 0.1 mm in the X-axis direction per pulse of irradiation of the linear energy beam so that the overlapping ratio in the X-axis direction of the linear energy beam becomes 75% when the oscillation frequency of the energy beam is set to 100 Hz. Namely, since the width in the X-axis direction of the linear energy beam is 0.4 mm, four shots in total of energy beam irradiation are effected to the same location.

In this embodiment, in order to avoid the overlapped region of the linear energy beam between the Nth column and the (N+1)th column from taking a form of straight line, the aforementioned optical system is shifted at random in the Y-axis direction within a range of ±2 mm and by the step of 0.5 mm per shot of energy beam irradiation.

Figure 5:
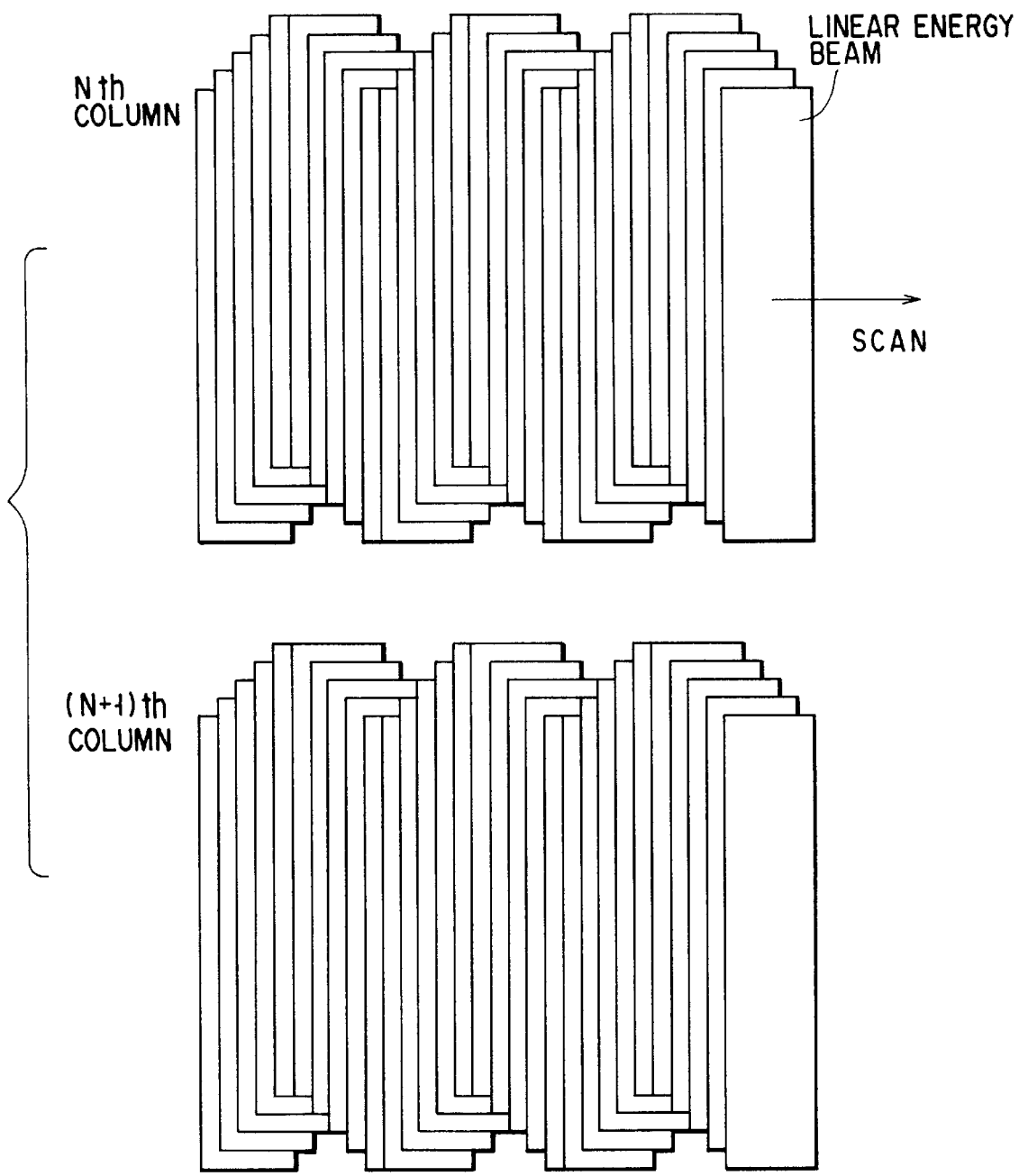
FIG. 5 shows a schematic view illustrating a manner of scanning in the Nth column and the (N+1)th column.

When the scanning of the linear energy beam to the Nth column is finished, the optical system including the first mirror 23 placed as a starting component and the image-forming lens 26 placed as a final component is shifted in the Y-axis direction by a distance of 96 mm, and then, the scanning of the linear energy beam to the (N+1)th column is performed. In this scanning, as in the case of the irradiation of the Nth column, the aforementioned optical system is shifted at random in the Y-axis direction within a range of ±2 mm and by the step of 0.5 mm per shot of energy beam irradiation. FIG. 5 schematically illustrates the resultant state of scannings of linear energy beam in the Nth column and the (N+1)th column.

Figure 7:
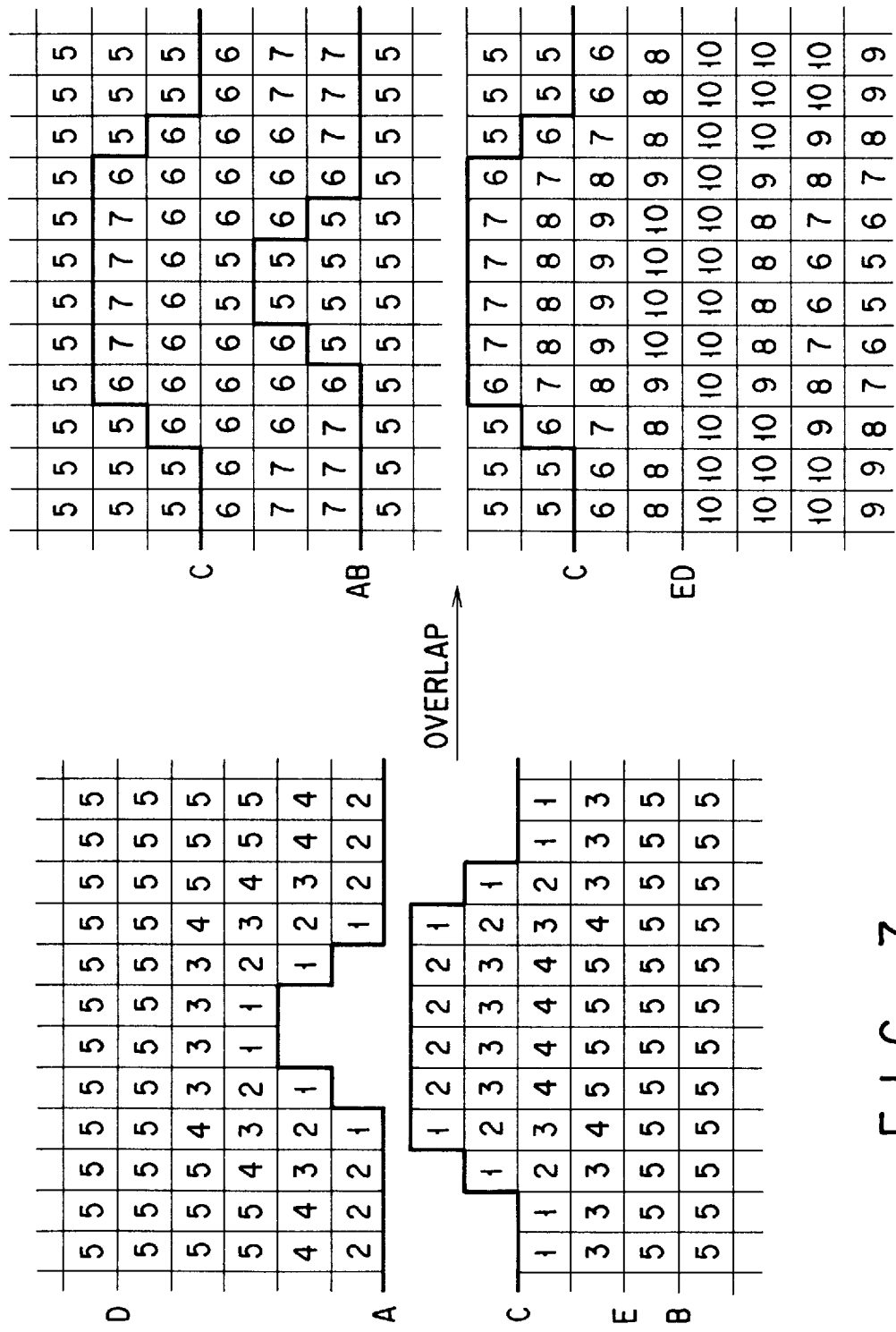
FIG. 7 shows graphs illustrating the number of shot of a linear energy beam in each of the Nth column and the (N+1)th column, and the combined number of shot when the energy beam of the Nth column are overlapped with the energy beam of the (N+1)th column.

FIG. 7 shows graphs illustrating the number of shot of a linear energy beam of each of the Nth column and the (N+1)th column, and the combined number of shot when the energy beam of the Nth column are overlapped by a distance of 0.1 mm in the X-axis direction and a distance of 0.5 mm in the Y-axis direction with the energy beam of the (N+1)th column. As apparent from FIG. 7, the number of shot in the overlapped region of the linear energy beam between the Nth column and the (N+1)th column changes moderately.

Figures 6A, 6B:
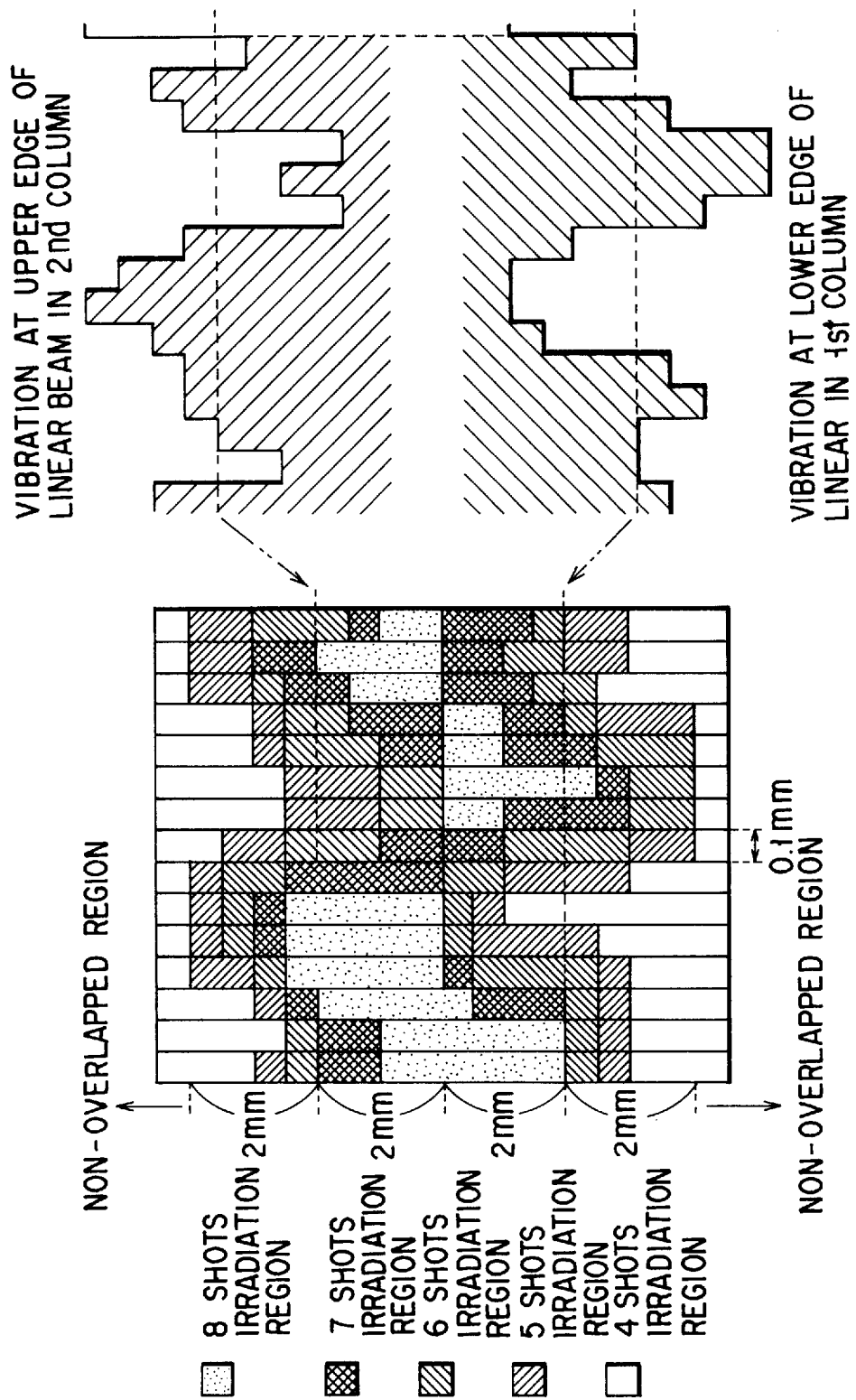
FIGS. 6A and 6B are enlarged views illustrating a manner of forming an overlapped region of linear energy beam to be formed between the Nth column and the (N+1)th column according to one embodiment of this invention.

FIG. 6A illustrates an overlapped region of linear energy beam, which has been formed between the Nth column and the (N+1)th column according to this embodiment. FIG. 6B illustrates the shape of the peripheral portions of linear energy beam in the Nth and the (N+1)th columns. As shown in FIGS. 6A and 6B, the overlapped region formed between the Nth column and the (N+1)th column is made random in shape, and hence the change in characteristics of TFT (in particular, threshold characteristics) at the boundary portion between the overlapped region and the non-overlapped region is made moderate. As a result, it is made difficult to visually recognize any non-uniformity in display image that might be induced by the overlapping region, thus making it possible to obtain a display image which is excellent to the naked eyes.

In the embodiment explained above, the irradiation of the linear energy beam is performed by scanning the linear energy beam in the X-axis direction while shifting it at random in the Y-axis direction in both of the Nth and the (N+1)th columns. However, it is also possible to confine the aforementioned random scanning in the Y-axis direction of the linear energy beam to the Nth column, allowing the scanning in the (N+1)th column to be performed linearly. Alternatively, it is also possible to perform the aforementioned random scanning in the Y-axis direction of the linear energy beam in the Nth column, and the scanning in the (N+1)th column is also performed in the same manner as in the Nth column. The shape of the boundary between the Nth column and the (N+1)th column may be made to take a periodic functional curve.

In the embodiments explained above, the linear energy beam is vibrated by shifting the optical system in the Y-axis direction. However, it is also possible to shift the stage instead of shifting the optical system.

Figure 8:
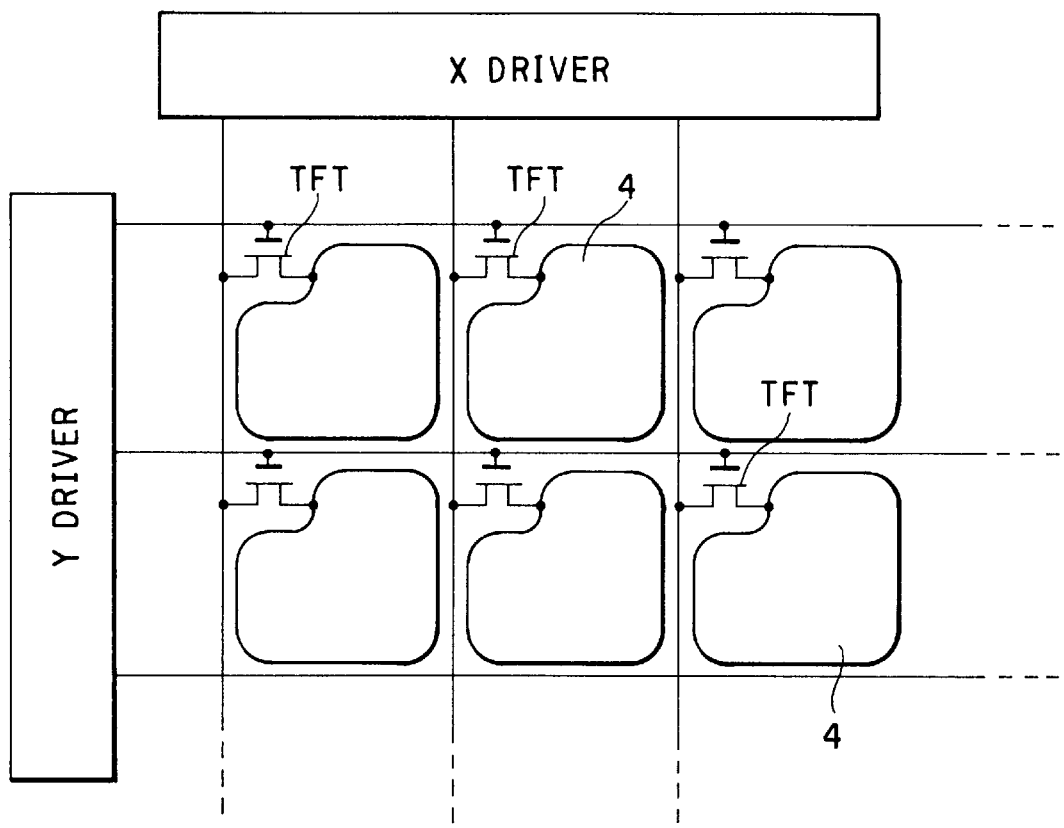
FIG. 8 is a schematic view of a liquid crystal device provided with a peripheral driving circuit.

In the above embodiments, this invention has been explained with reference to the case where this invention is applied to the manufacture of the TFT of pixel region. However, it is also possible to apply this invention to the peripheral driving circuits, i.e. the X driver and Y driver shown in FIG. 8. In this case, in order to prevent the X driver from crossing over the overlapped region of the linear energy beam between the Nth column and the (N+1)th column, the direction of scanning of the linear energy beam should be made parallel with the extending direction of the X driver so as to allow the overlapped region of the linear energy beam to be eluded from the X driver.

Figure 9:
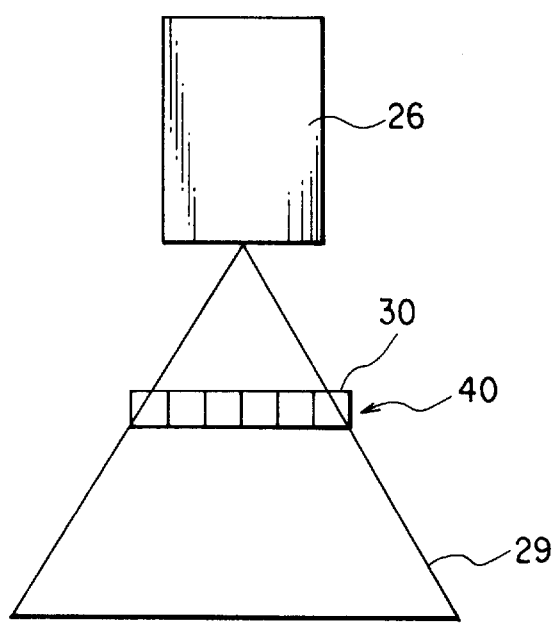
FIG. 9 is a schematic view of another embodiment of an apparatus for producing a non-linear overlapped region of linear energy beam.

Further, in the above embodiments, the overlapped region of the linear energy beam between the Nth column and the (N+1)th column is made non-linear by shifting the optical system or stage in the Y-axis direction. However, it is also possible to dispose an optical modulation element array 40 underneath the optical system of imaging lens by arranging a plurality of optical modulation elements 30 along the linear energy beam 29 as shown in FIG. 9, and then to change the refractive index or transmittance of the optical modulation element 30 which is located at the edge portion of the linear energy beam.

As explained above, this invention is featured in that the region to be overlappingly irradiated is made non-linear at the occasion of scanning linear energy beam in the manufacture of a TFT. As a result, it is possible to make difficult to visually recognize any non-uniformity in display image, which is originating from a difference in characteristics of the individual TFT that has been induced by the dosage of energy beam, and hence to obtain an excellent display image.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a liquid crystal display device, which comprises the steps of forming an amorphous silicon layer on a substrate; and irradiating, by way of scanning, a linear energy beam onto the amorphous silicon layer, thereby converting an irradiated portion of the amorphous silicon layer into a polycrystalline silicon layer; wherein the irradiation and scanning of the linear energy beam are performed plural times while shifting the scanning of the linear energy beam so as to allow the irradiation of the linear energy beam to cover every region of the amorphous silicon layer that is desired to be converted into a polycrystalline silicon layer, and the scanning of linear energy beam is performed in such a manner that an edge portion of one irradiated region is overlapped by an edge portion of the next neighboring irradiated region in a plurality times of scanning of the linear energy beam thereby forming an overlapped region, and that a boundary to be formed between the overlapped region and non-overlapped region becomes non-linear in shape.

2. The method of manufacturing a liquid crystal display device according to claim 1, wherein said scanning of linear energy beam is performed while vibrating the linear energy beam in perpendicular to the direction of scanning.

3. The method of manufacturing a liquid crystal display device according to claim 1, wherein at least one of the Nth scanning and (N+1)th scanning among said plural scannings is performed while vibrating the linear energy beam in perpendicular to the direction of scanning.

4. The method of manufacturing a liquid crystal display device according to claim 1, wherein said linear energy beam is scanned in a predetermined direction, and said substrate is vibrated in perpendicular to the direction of scanning.

5. The method of manufacturing a liquid crystal display device according to claim 1, wherein said substrate to be irradiated with the linear energy beam is provided at the periphery thereof with an X driver circuit which is parallel with a longitudinal axis of said substrate and with a Y driver circuit which is parallel with a lateral axis of said substrate, and the scanning direction of the linear energy beam is approximately parallel with at least one of said driver circuits.

6. The method of manufacturing a liquid crystal display device according to claim 5, wherein said at least one of said driver circuits is irradiated with only one time of scanning of the linear energy beam.

7. The method of manufacturing a liquid crystal display device according to claim 5, wherein said scanning direction of linear energy beam is approximately parallel with said X driver circuit.

8. The method of manufacturing a liquid crystal display device according to claim 1, wherein a shape of the boundary between the overlapped portion and the non-overlapped portion is close to a periodic functional curve.

9. The method of manufacturing a liquid crystal display device according to claim 1, wherein said linear energy beam is excimer laser beam.

10. The method of manufacturing a liquid crystal display device according to claim 1, wherein an optical modulation element array comprising a plurality of optical modulation elements which are capable of changing their refractive index or transmittance is disposed in an optical passage of the linear energy beam, and a formation of non-linear boundary between the overlapped region and the non-overlapped region is effected by changing the refractive index or transmittance of the optical modulation element which is located at an edge portion of the linear energy beam.

* * * * *